United States Patent [19]
Parker et al.

[11] Patent Number: 5,208,504
[45] Date of Patent: May 4, 1993

[54] SAW DEVICE AND METHOD OF MANUFACTURE

[75] Inventors: Thomas E. Parker, Framingham; James A. Greer, Andover, both of Mass.

[73] Assignee: Raytheon Company, Lexington, Mass.

[21] Appl. No.: 643,923

[22] Filed: Dec. 28, 1990

[51] Int. Cl.$^5$ ............................................. H01L 41/08
[52] U.S. Cl. ................................... 310/313 R; 310/344
[58] Field of Search .......... 310/313 R, 313 A, 313 D, 310/348, 344, 346; 333/151, 153, 194, 195, 155; 331/135, 176, 65, 107 A

[56] References Cited

U.S. PATENT DOCUMENTS

| | | | |
|---|---|---|---|
| 4,213,104 | 7/1980 | Cullen et al. | 310/313 R X |
| 4,270,105 | 5/1981 | Parker et al. | 310/313 R |
| 4,409,570 | 10/1983 | Tanski | 310/313 A X |
| 4,639,697 | 1/1987 | Yarranton et al. | 310/313 R X |
| 4,933,588 | 6/1990 | Greer | 310/313 R X |
| 5,039,957 | 8/1991 | Greer et al. | 310/313 A X |
| 5,059,848 | 10/1991 | Mariani | 310/313 R |

FOREIGN PATENT DOCUMENTS 2171850  9/1986  United Kingdom .

OTHER PUBLICATIONS

Bikash K. Sinha, Stanley Locke, "Acceleration and Vibration Sensitivity of SAW Devices", IEEE Transations vol. 34, No. 1 Jan. 1987.

*Primary Examiner*—Mark O. Budd
*Attorney, Agent, or Firm*—Richard M. Sharkansky

[57] ABSTRACT

A SAW oscillator package having low vibration sensitivity includes a stiffener layer disposed between a mounting surface for the oscillator and the oscillator circuit package. Preferably, the stiffening layer comprises a slab of a highly stiff material such as a ceramic and, in particular, aluminum oxide, as well as other material which preferably have suitable thermal expansion coefficients matched between the material of the package and the mounting surface. Moreover, the rigidly of the SAW device itself is also increased by either reducing the lateral dimensions of the SAW device or increasing the thickness of the SAW substrate and/or cover.

13 Claims, 7 Drawing Sheets

SAW DEVICE AND METHOD OF MANUFACTURE

BACKGROUND OF THE INVENTION

This invention relates generally to surface acoustic wave stabilized oscillators and, more particularly, to surface acoustic wave stabilized oscillators having low vibration sensitivity.

As it is known in the art, surface acoustic wave devices (SAW devices) are employed in a variety of applications, such as resonators and delay lines for oscillator circuits, as well as, filters and pressure transducers. Generally, a SAW device comprises at least one transducer including a set of conductive members which is disposed on or recessed within a surface of a piezoelectric substrate.

In many applications of SAW devices, particularly with respect to applications of resonators and delay lines, as frequency stabilizing and determining elements in oscillators, it is important to provide a package having a relatively small size while, at the same time, properly mounting the SAW device within the package to reduce the so-called vibration sensitivity of the SAW device. It is known that the resonant frequency of an oscillator, including a SAW device, is sensitive of external vibration or changes in external stress applied to the SAW device. The sensitivity results from the external stress on the piezoelectric substrate causing changes in surface wave velocity and hence resonant frequency characteristics of the SAW device. In particular, the surface wave velocity is influenced by applied forces through the second order elastic coefficients of the material of the SAW substrate and also because the physical distance between the transducers or gratings on the substrate is changed. Thus, both of these factors contribute to net frequency change in SAW devices such as delay lines and resonators.

Conventional packages such as the TO-8 package and flatpacks which are hermetically sealed are often used. Such packages are relatively large in volume in comparison to the size of the SAW device. These packages also constrained how the SAW substrate can be mounted within the package to provide a SAW device having a surface wave velocity which is relatively invariant with external stress.

It is generally known that a low vibration sensitivity is obtained when the bottom of the SAW device substrate is uniformally supported. One approach is to provide a soft stress reducing material such as a rubber or a room temperature vulcanizing silicon rubber on the conventional package to uniformally support the bottom of the SAW device substrate. It has been found, however, that such a soft material causes long-term frequency shifts in SAW devices provided within such packages because over time the soft material will outgas impurities which may become deposited upon the upper surface of the SAW device substrate. Such deposits of impurities are believed to cause changes in the velocity characteristics of the surface waves which propagate along the upper surface of the substrate and hence change the long term frequency characteristics of the device. These frequency characteristics are often of a magnitude so large that the device is no longer acceptable for many applications. On the other hand, rigidly fastening the bottom of the SAW substrate to the package is also generally unacceptable since the thermal expansion characteristics of the SAW substrate are generally not perfectly matched to the thermal expansion characteristics of the material of the package. Because of this mismatch in thermal expansion characteristics, this arrangement leads to unpredictable temperature dependent stress characteristics that adversely effect frequency stability and may even result in fracture of the base of the SAW device.

Once solution to the foregoing problem has been to provide a hermetically sealed package in which the SAW substrate provides a bottom portion of the package. Such arrangements are shown in U.S. Pat. No. 4,270,105, Parker, et al., issued May 26, 1981, entitled "Stabilize Surface Wave Device" and assigned to the assignee of the present invention and in articles entitled "Long Term Aging and Mechanical Stability of 1.4 Gigahertz SAW Oscillators" by M. Gliden, et al., Proceedings of the IEEE Ultrasonic Symposium, page 184 and "SAW Resonator Frit Bonded Pressure Transducer" by D. Weirauch, et al., Proceedings of the IEEE Ultrasonic Symposium, 1979, page 874.

The issued U.S. Patent describes a quartz package having the hydrophobic polymer coating for passivating an upper surface of the substrate on which the surface waves propagate. The article by Gliden describes a SAW based oscillator including a quartz packaged SAW device. Long term aging data indicates that such devices will have frequency shifts of at least ±4 parts per million per year. For some applications in stable oscillators, this drift or aging characteristic is unacceptable. The second article by Weirauch describes a pressure transducer fabricated having a quartz package. According to this article, a frit was applied to both surfaces, the SAW was evacuated, and the substrates were then mated together. As indicated in the article, a hysteresis effect was observed. This indicates that there may be a stress relief problem associated with the technique. It was also suggested that some long term frequency shift effects may be present. These short term and potential long term drift problems may be unacceptable for SAW devices such as delay lines and resonators when used in highly stable precision oscillators.

A solution to these problems of aging and short term frequency shift has been the All-Quartz Package (AQP) as mentioned in a paper entitled "A New All-quartz Package for SAW Devices" by Parker, et al., 39th Annual Frequency Symposium, 1985, pages 519–524. The approach has been used to provide devices such as resonators having very low aging rates (typically less than 0.5 parts per million per year). The approach has also been used on delay lines. The distinction made between SAW resonators and SAW delay lines is that a SAW resonator generally also has a pair of gratings disposed on the surface wave surface outside of the region of the pair of transducers. The resonator thus provides a high Q narrow band device whereas the SAW delay line does not have such a pair of gratings and is a broaderband, lower Q device.

The vibration sensitivity of SAW devices used in SAW stabilized oscillators is particularly important for radar applications where the SAW stabilized oscillator will be in a high vibration environment, such as, for example, on a plane, helicopter, or missile. Frequency fluctuations induced by external vibrations can cause a significant increase in oscillator phase noise levels at the vibration frequencies and therefore degrade the performance of the radar. Theoretical predictions of the vibration sensitivity for the all-quartz package resonators indicate that vibration sensitivities as low as $10^{-11}$ fractional change in frequency per g of applied force should be attainable in each of the three orthogonal directions of the SAW device. Such performance will be comparable to or better than any known oscillator technology (i.e. bulkwave technologies or dielectric resonator technologies for example). In practice, however, it has not been heretofore possible to provide SAW stabilized oscillations in which the SAW device exhibits such low SAW vibration sensitivities.

SUMMARY OF THE INVENTION

In accordance with the present invention, a SAW stabilized oscillator includes means for providing a closed loop having an integral multiple of $2\pi$ radians of phase shift and excess small signal gain at a desired frequency, said means including a SAW device having a substrate including a surface which supports surface wave propagation and a pair of transducers coupled to said surface wave propagating surface. The SAW oscillator further includes a package comprising a base portion, said base having a first stiffness characteristic, and said base supporting said closed loop providing means. The SAW oscillator further includes means coupled to said base for increasing the stiffness of said base. With such an arrangement, the stiffening means reduces bending of the SAW oscillator package in response to applied external stresses. By lowering oscillator package bending in response to external stresses, the SAW device which is supported by the oscillator package will have concomitantly lower external bending stresses coupled to it and concomitant therewith lower vibration sensitivity.

In accordance with a further aspect of the present invention, a SAW oscillator includes means for providing a closed loop having an integral multiple of $2\pi$ radians of phase shift and excess small signal gain at a selected frequency. Said means further includes a surface acoustic wave resonator having a substrate with a surface which supports surface wave propagation, a pair of transducers coupled to said surface wave propagation surface, and a pair of gratings disposed outside of the region occupied by said pair of transducers for confining surface wave energy to the pair of transducers. The SAW device further includes a glass frit seal and a cover used in combination to enclose the surface wave propagation surface of the SAW substrate. The SAW oscillator further includes an oscillator package comprising a base having a frame portion affixed to said base with said base supporting said SAW resonator and said means for providing a closed loop and said base having a first stiffness characteristic. A cover is disposed over the base of the SAW oscillator package and a first slab of a stiff ceramic material is disposed over the cover to increase the stiffness of the cover and a second slab of a stiff ceramic material is disposed over the base to increase the stiffness of the base. With such an arrangement, a SAW stabilized oscillator having low levels of vibration sensitivity is provided. The use of slabs of stiff ceramic material over the cover and base provide an oscillator package having a relatively small size yet having a high degree of stiffness which inhibits external stresses from bending the oscillator package. The reduced bending of the oscillator package provides concomitantly reduced bending of the SAW resonator. Thus, providing a SAW stabilized oscillator having low levels of vibration sensitivity compared to prior techniques.

BRIEF DESCRIPTION OF THE DRAWINGS

The foregoing features of this invention, as well as the invention itself, may be more fully understood from the following detailed description of the drawings, in which.

DESCRIPTION OF THE PREFERRED EMBODIMENTS

Figure 1:
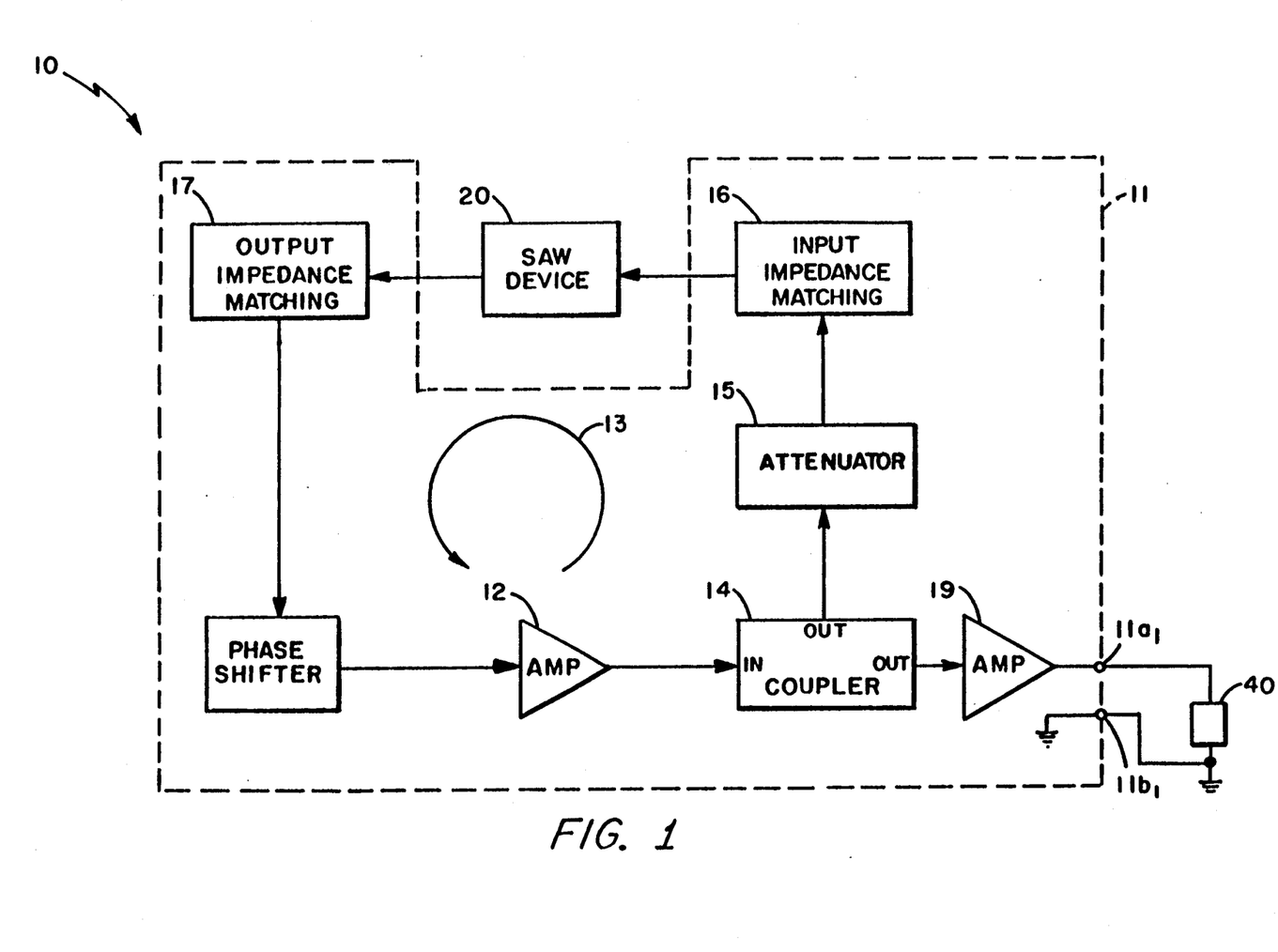
FIG. 1 is a block diagram showing the SAW resonator used as a frequency stabilizing determining element in an oscillator circuit.

Referring now to FIG. 1, a stable oscillator 10 is shown to include an amplifier 12 disposed in a feedback loop denoted by an arrow 13. The feedback loop 13 further includes coupling means 14, attenuator 15, input impedance matching network 16, a SAW device 20, an output impedance matching network 17, and a phase shifter 18. The SAW device 20, here a resonator, is used in the feedback loop 13 to stabilize the phase and frequency characteristics of the signal in the feedback loop 13. The output of the amplifier 12 is coupled to here the input port of the coupling means 14. The coupling means 14 is here a microstrip type directional coupler although a center tap transformer may alternatively be used. A first branch output port of coupler 14 is coupled to the attenuator circuit 15. A second branch port, here an output port of the coupler means 14, is coupled to a second amplifier 19. Here, a conventional amplifier used to provide an amplified output signal to output terminals $11a_1$, $11b_1$. The coupling means 14 is thus used to divide the output signal provided from amplifier 12 and to feed a first portion of the signal to a conventional attenuator and in a second portion signal to the output amplifier in a predetermined ratio. A division ratio of 10 to 1 is typically used so that 1 part in 10 of the signal is fed to the input of the output amplifier and the remaining portion of the signal is coupled to attenuator 15 and is fed back to the amplifier 12 via the remaining portion of the feedback loop 13. The output amplifier 19 is used to provide an amplified output signal in response to the signal provided by the oscillator circuit 10 and to feed such amplified output signal to output terminals $11a_1$, $11b_1$ and hence to a load 40.

The frequency of the oscillator 10 is related to the closed loop phase and frequency characteristics of the feedback loop. Such a circuit will oscillate at a frequency in which the phase shift around the loop is $2\pi$ radians and at which the loop has excess small signal gain, as is known. The phase and frequency characteristics of the feedback loop 13 are thus adjusted by the phase shifter 18 which is used to change the oscillator frequency. The phase and frequency characteristics of the SAW resonator 20, phase shift, and other components of the feedback loop, as is known in the art, also contribute to determining the phase and frequency characteristics of the loop. The attenuator circuit 15 may optionally be required to control the signal level in the feedback loop 13 of the oscillator 10. Also, depending upon the characteristics of the various circuits, conventional input and output impedance networks 16 and 17 are optionally used to match the impedances in the feedback to the impedances of the SAW resonator 20. Such impedance matching circuits 16, 17 and attenuator circuit 15 however are not always required.

The SAW resonator 20 or alternatively a SAW delay line (not shown) in combination with the phase shifter 18 provides a fixed and coarsely adjustable phase shift to the input of the amplifier 18 thereby supplying the requisite phase shift characteristics to the input of the amplifier 12 at a particular frequency. Phase shifter 18 could be a coarsely adjustable phase shifter, a electronically controlled phase shifter provided by varactor diodes, for example, or other suitable phase shifter elements, as is commonly known in the art. The major portion of the phase shifter in the feedback loop, is provided by the resonator 20 (or alternatively delay line) with the phase shifter 18 providing a relatively small adjustment in the phase characteristics in the feedback loop thus enabling tuning of the resonant circuit of the oscillator to a desired frequency output frequency. Since the SAW device 20 provides a substantially complete and relatively stable portion of the delay around the feedback loop, the frequency of the oscillation from the oscillator will be likewise relatively stable.

In particular, for precision oscillator applications in a vibrating environment, the effects of applied external stress on the SAW oscillator results in fluctuations in the frequency of oscillation of the output signal from the oscillator. It is generally desirable to reduce such fluctuations to significantly low levels. Theoretically, oscillators using SAW resonators as stabilizing elements could exhibit vibration induced frequency fluctuations in the order of about $10^{-11}$ fractional change in frequency per "g" of applied force where g is the acceleration due to gravity.

Figure 2:
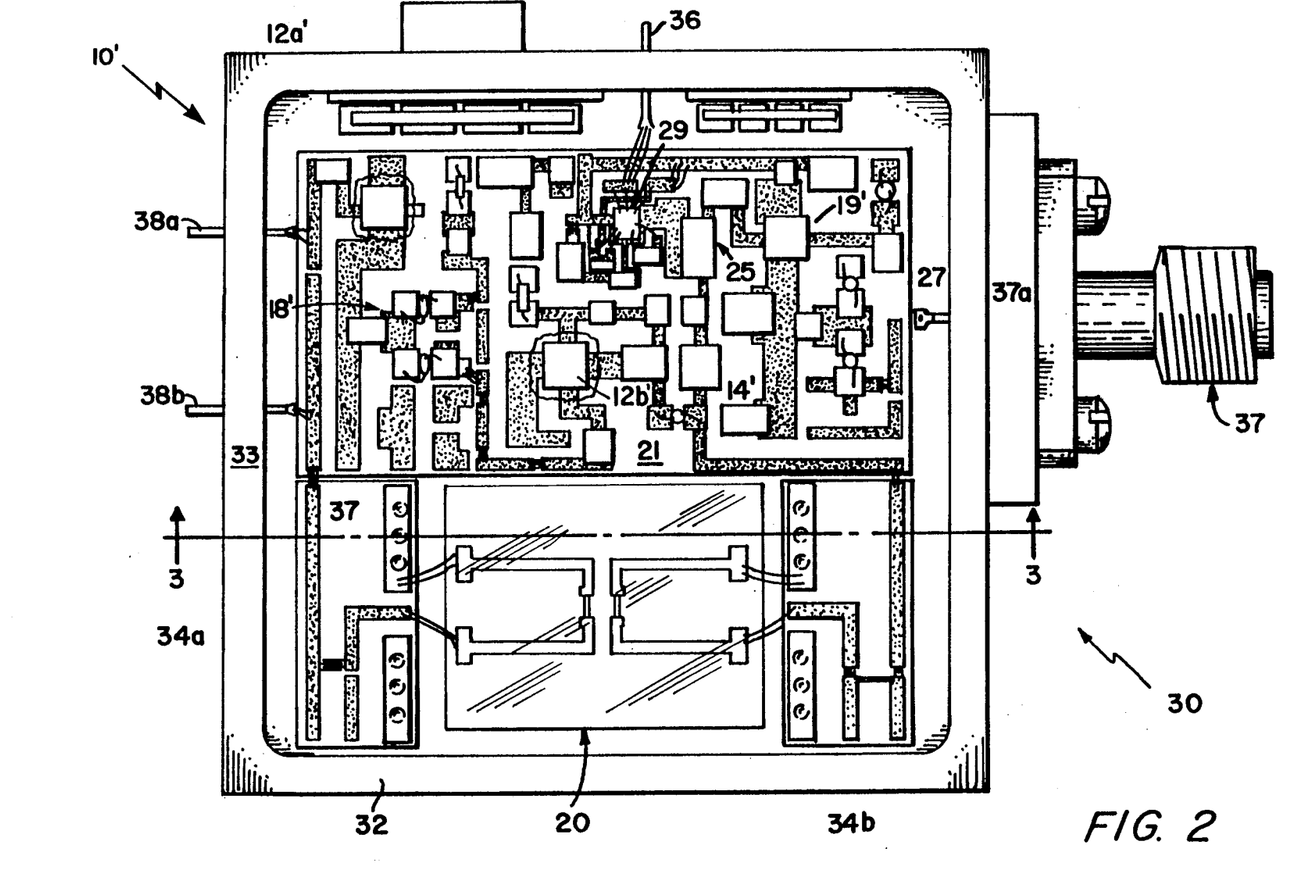
FIG. 2 is a plan view of a SAW oscillator package having a SAW device and hybrid circuitry used to provide the SAW oscillator supported in the package.

Referring now to FIG. 2, a typical implementation 10' of the SAW oscillator 10 (FIG. 1) is shown to include a first dielectric carrier 21, here comprised of alumina (i.e. aluminum oxide), having disposed over a first side thereof pattern strip conductors comprised of here gold (not numbered) and having disposed over a second surface thereof a ground plane conductor of here gold (not shown) bonded into an oscillator package 31. The patterned conductors are arranged to provide interconnections to the amplifiers 12a', 12b', as shown, as well as the other components of the oscillator 10'. Here two amplifiers 12a' and 12b' are used to provide the amplifier 12 (FIG. 1) in the feedback loop 13 to provide sufficient small signal gain at a desired frequency. The circuit in FIG. 2 further includes a phase shifter 18', here a fixed frequency phase shifter comprised of a L-C-L T-network (not individually referenced), and a directional coupler 14', which with the amplifiers 12a', 12b' complete the components on carrier 21 which are part of the feedback loop 13 (FIG. 1). Disposed here outside of the loop is an attenuator 25 as well as the amplifier 19' and a low pass filter 27.

The output from low pass filter 27 is provided to a strip conductor (not referenced) which is coupled by bond wires to a center conductor 37a of a standard coaxial connector 37, here an SMA type connector. Connector 37 is attached to the package 31 via a pair of screws (not numbered). The package 31 includes a base 33, as well as, an outer peripheral frame portion 32 which is integrally provided with the base 33. That is, the base 33 is here machined from a slab of material (such as "KOVAR" which is gold plated) to form the recessed base portion and provide the frame 32 disposed about the periphery of the base 33 of the package 31. A through-pin 36 is disposed through the frame 32 of package 31 and dielectrically isolated therefrom to provide DC bias to a voltage regulator integrated circuit on carrier 21. The other circuits on carrier 31 are connected by conductors from the voltage regulator 29 to provide regulated DC voltages to the various circuits, as would generally be known to one of skill in the art. Through-pins 38a, 38b are also provided through the package 31 and are used for testing purposes but are generally disconnected, during user operation. The strip conductors (not numbered) disposed adjacent the pins are jumped together with bond wires for normal operation of the oscillator. Pins 38a, 38b and breaks in the strip conductor (not numbered) adjacent the pins 38a, 38b are provided such that during testing and calibration an open loop condition can be provided which is used to set the various parameters of the loop, whereas after testing a closed loop is provided by disposing conductors (not shown) across the break in strip conductors adjacent the pins and disconnecting the pins. Distributed as needed on the carrier 21 are ground conductor strips 37 which are coupled to the ground plane conductor (not shown) on the underside of carrier 21 by plated vias 37a, as shown.

The oscillator 30 further includes the SAW device here a resonator 20 mounted between a pair of carriers 34a, 34b here also comprised of alumina and which have on a first underside thereof a ground plane conductor (not shown) and have disposed on the top surfaces thereof the ground conductor strips 37 having plated via holes 37a, as well as, patterned strip conductors used to provide microstrip transmission lines to interconnect the SAW resonator to the hybrid circuit generally provided on carrier 21.

The exact implementation of the oscillator circuit generally denoted as 30 and as described above would be apparent to one of ordinary skill in the art and any oscillator design would be useful in practicing the present invention.

Preferably, in order to reduce vibration sensitivity, the integrated circuits, in particular, the amplifier circuits 12a, 12b, and 19 are bonded to the surface of the carrier 21 by use of here a non-conductive epoxy. One particular epoxy used is "EPO-TEK" type H70E-175 (Epoxy Technology, Inc., Billerica, Mass. Conductive epoxies which are used in the hybrid to fasten components securely to the carrier include EPO-TEK H20E-175. It is important when fabricating the particular hybrid circuit 11 on a carrier 21 that the components be securely affixed to the carrier 21 to prevent microphonic induced noise in the oscillator.

Figure 3:
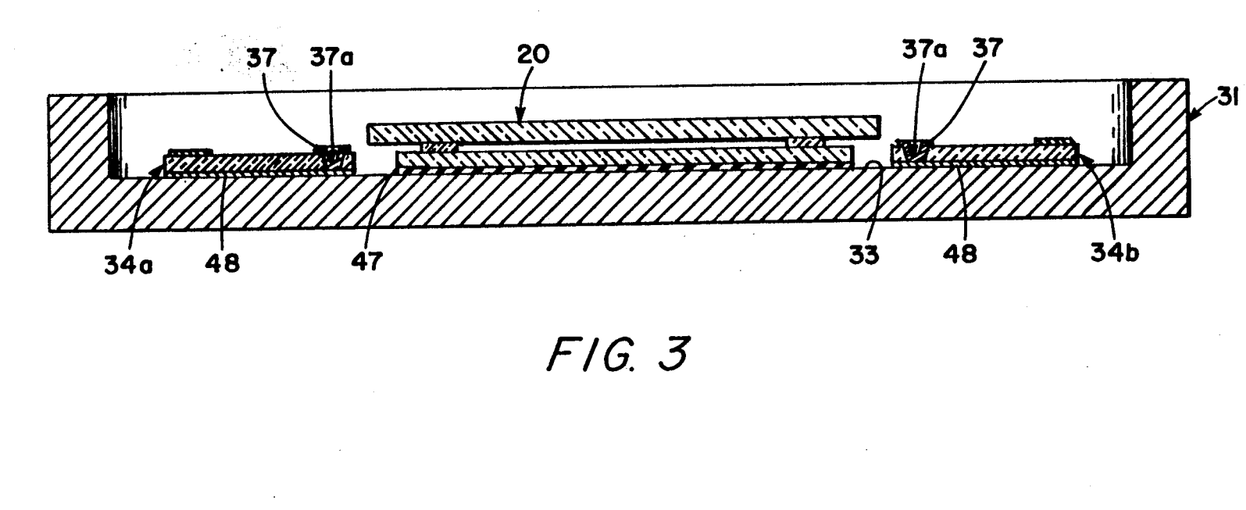
FIG. 3 is a cross-sectional view taken along lines 3—3 of FIG. 2.

The SAW resonator is here obtained from Raytheon Company, Research Division, Lexington, Mass., or Raytheon Microwave and Power Tube Div Northborough, Mass. (SMDO) and is a resonator, packaged in a Raytheon All-Quartz Package although another resonator may alternatively be used. It would be preferred that the base of the SAW device provide part of the package. In particular, as shown in FIG. 3, the so-called All-Quartz Package resonator includes a base 20a having transducers (not numbered) disposed in recesses provided therein and gratings not shown and which is spaced from a cover portion 20c and secured to the base by a glass frit seal 20b. Here for best vibration performance the cover 20c portion of the package is mounted on the base 33 of the oscillator package 31. The cover 20c is thus spaced from the base by the glass frit seal 20c which in combination provide a sealed enclosure for the resonator. In the All-Quartz Package the cover and base are crystallographically matched substrates and are both comprised of an ST-cut of quartz. The exact ST-cut being specified by the user depending upon temperature considerations as is known.

The above resonators are generally characterized as having low, long-term aging drift characteristics on the order of 0.5 parts per million per year, as well as, low noise and other attributes useful for high precision fixed frequency oscillator circuits.

As shown in conjunction with FIG. 3, the carriers 34a and 34b are secured to the base of the package 31 using a conventional epoxy bond 48 whereas the all-quartz package SAW device 20 is mounted upside down in the oscillator circuit 33 and is attached to the oscillator circuit 33 by use of a sheet adhesive 47 generally known as 3M (Minneapolis, Minn.), "Isotac" A-10 adhesive, part number Y-9473 having a thickness of 0.010 inches. This adhesive is preferred although other adhesives or tapes may alternatively be used.

In general, the oscillator package 31 is comprised of a metal such as Kovar. The Kovar which is an alloy of 29% Ni, 17% Co, 0.3% Mn and balance Fe has a certain elastic modulus (Young's modulus) characteristic. It has a concomitant stiffness characteristic which is related to the thickness of the base, orientation of the frame, and elastic modulus of the material of the package 31.

Figure 4:
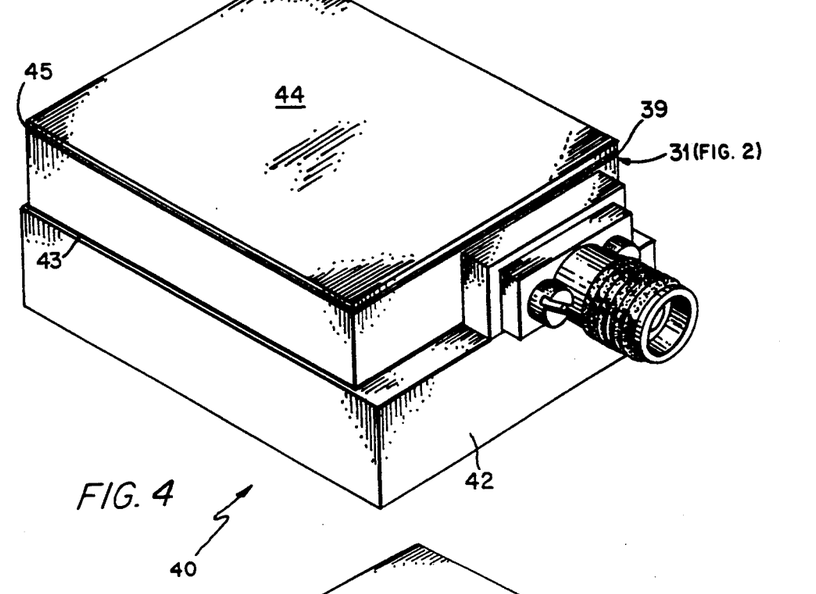
FIGS. 4 and 4A are isometric views showing a SAW oscillator package having stiffener layers in accordance with the present invention.
Figure 4A:
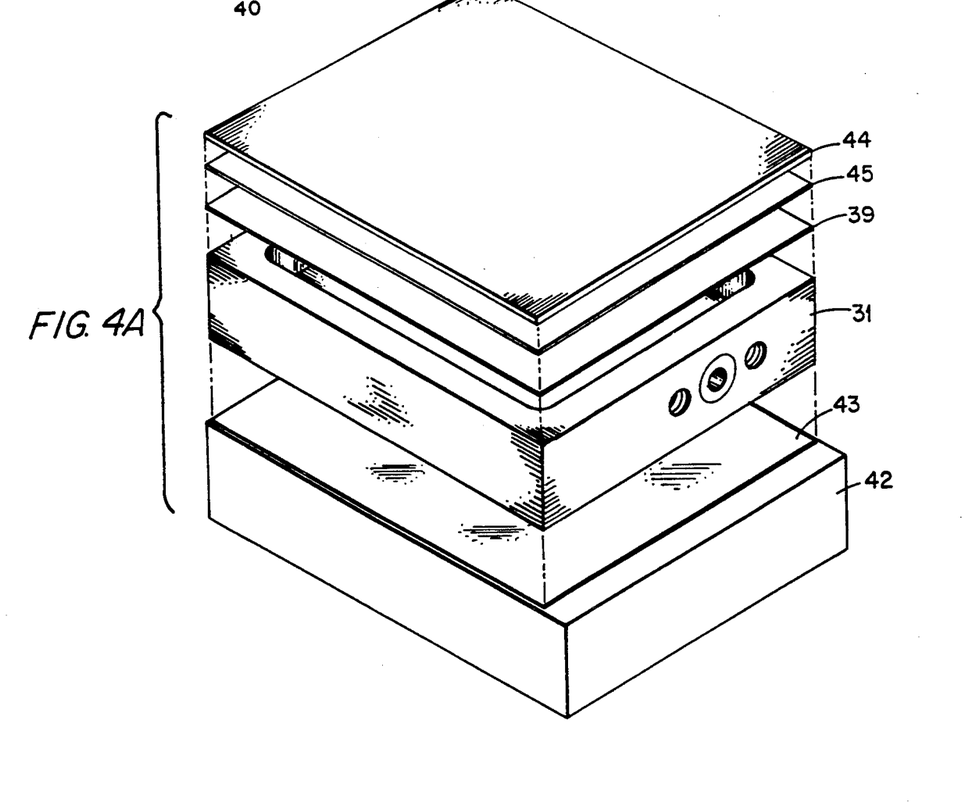

Referring now to FIG. 4, a SAW oscillator having stiffening means to reduce vibration induced changes in oscillator frequency is shown to include the packaged device 30 as generally described in conjunction with FIG. 2 having disposed thereover a cover 39 here also comprised of gold plated Kovar as for package 31 and which is seam welded to the package 31 using conventional seam welding techniques known in the art. Disposed on the bottom portion of package 31 is a SAW package stiffening member 42 here a slab comprised of a high Young's modulus material which exhibits a high degree of stiffness (that is, rigidity) and which is used to stiffen or make more rigid the base 33 of the oscillator package 31 and thus couple a reduced magnitude of external stresses to the SAW resonator.

As with the stiffness or rigidity characteristic of the package, the stiffness of the slabs is related to the thickness of the slab 42 and the modulus of elasticity of the material of the slab. Thus, the thicker the slab, the higher the stiffness. For most practical applications, particularly where space considerations are a factor, slabs having a thickness in the range of about 0.1 inches to 0.5 inches are preferred. A preferred range is 0.3 inches to 0.5 inches. Greater thickness could, of course, be used if space and, in particular, height are not restricted. The stiffening member 42 is here a slab of aluminum oxide. Disposed over cover 39 is a cover stiffening member 44 here comprised of a material having a high degree of stiffness and particularly a high Young's modulus. The material here used is also aluminum oxide since aluminum oxide has good thermal match properties to the Kovar. The cover stiffner member 42 has a thickness in the range of 0.1 inches to 0.5 inches also. Other materials having higher Young's modulus and thus higher degrees of stiffness may alternatively be used for both cover stiffener 44 and base stiffener 42.

The oscillator package 31 is firmly affixed between the base stiffener 42 and cover stiffener 44 by use of a thermoplastic sheets 43, 45, respectively, which soften at an elevated temperature and then provide bonds between the package 31 and the respective stiffener members 42 and 44 to secure such members to the package 31. A preferred material used to fasten the package 31 to the stiffener members is "Chomerics Chobond" type 1670 (Chomerics, Inc., Woburn, Mass.). Other adhesive fasteners may alternatively be used. Here the thermoplastic sheet is used to permit reworking of the devices if necessary since the stiffener members can be relatively easily removed from the base 33 and cover 39 portions of the package 31. Alternative materials can also be used to fasten the stiffeners to the packaging cover. For example, Crystal-bond 555 from Aremco, Inc. (Ossining, N.Y.), a waxy type of bond, as well as, Crystal-bond 509 from Aremco which is also a waxy type of bonding adhesive may alternatively be used. It is preferred to have a somewhat elastomer type of bonding adhesive between the Kovar and the alumina stiffness to take into consideration the small, but nevertheless, important differences in coefficients of thermal expansion between the two materials if the oscillator 40 is to be operated over varying temperature ranges.

Low vibration sensitivity is provided from the device as described in conjunction with FIGS. 1-4 by providing a SAW resonator having a glass frit geometry suitable for low vibration sensitivity, as generally described in an article entitled: "An Analysis of the Normal Acceleration Sensitivity of ST Cut Quartz Surface Wave Resonators Rigidly Supported along the Edges" by Tiersten, et al., Proceedings of the 41st Annual Symposium on Frequency Control, 1987, pages 282-288. Any one of the preferred frit geometries identified by the authors in the paper may be used to provide optimum performance. The theory set forth by the authors state that with proper choice of the frit geometry, vibration sensitivities in the low $10^{-11}$ fractional parts frequency per "g" of applied stress range would be obtainable, such low vibration sensitivity levels have not been observed in practice. One of the problems with the theoretical analysis is that it is based on the assumption that the frit geometry is perfect everywhere and that there are no misalignment or local deviations from straight lines. Furthermore, another assumption is that the applied acceleration is uniformally distributed over the entire mounting surface of the SAW device. In practice neither one of these assumption is perfectly true. That is, the SAW device is generally not mounted uniformally over the Kovar package base and due to differences in the melt characteristics of the glass frit, the glass frit pattern will deviate from the ideal theoretical patterns described in the above article.

In accordance with this invention, the SAW oscillator package 31 is stiffened to provide a reduction in vibration sensitivity. In response to external stresses on the package 31, strains are provided in the material of the package. That is, the package 31 bends in response to applied external stresses. Bending and straining of the package causes concomitant bending and straining of the SAW resonator 20 which is mounted to the package base 33 (even though the SAW resonator may be mounted upside down on the package). At the vibration levels of interest (DC to 10's of KHz), such minute strains and bending become extremely important.

In accordance with the invention, by stiffening the Kovar package, that is, by providing a slab of very stiff material on the base portion of the package, as well as, a slab of very stiff material over the cover portion of the package, the amount of bending and flexing of the Kovar package in response to applied forces is significantly reduced and thus concomitant therewith the bending of the SAW oscillator is also significantly reduced.

Figure 5:
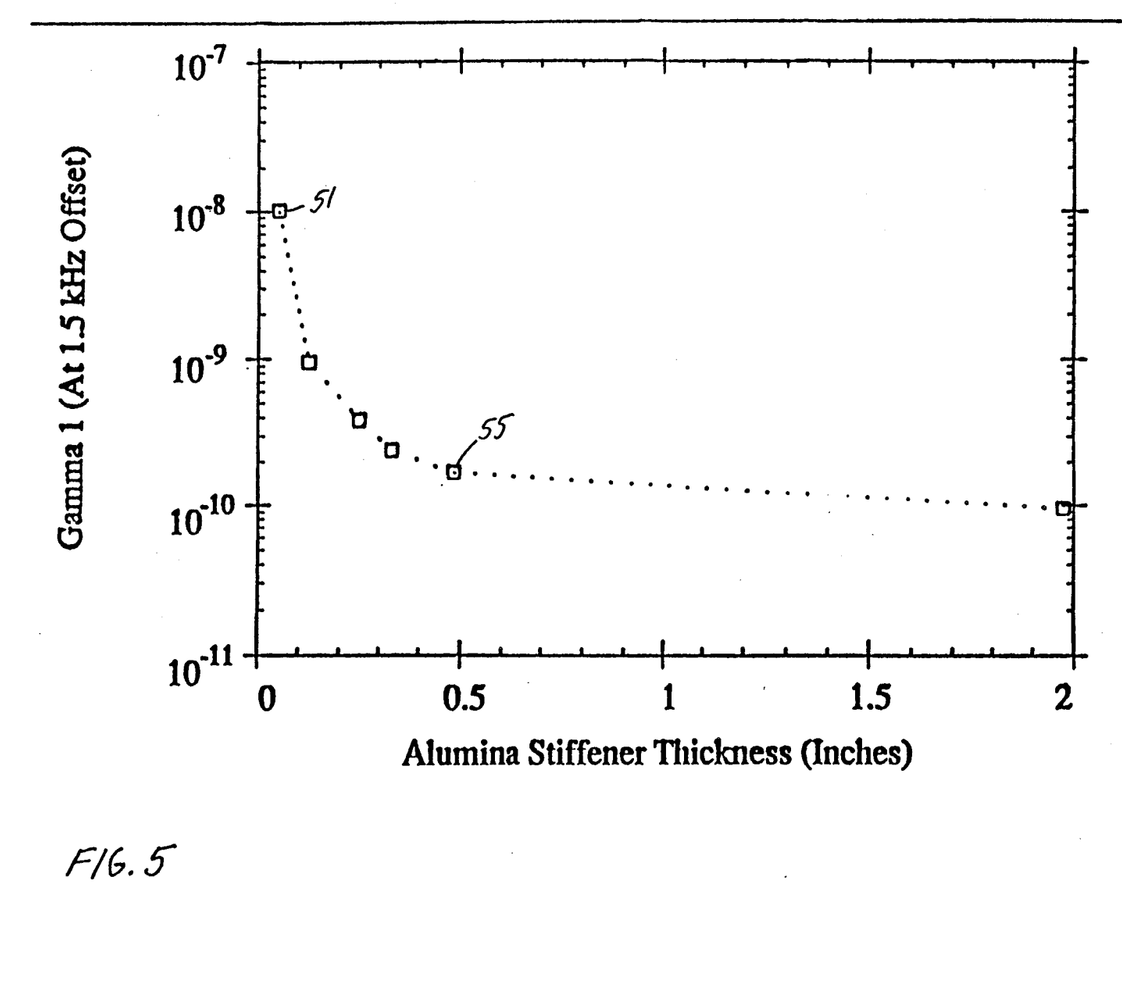
FIG. 5 is a plot of vibration sensitivity for vibrations parallel to the substrate normal vs. stiffner thickness.

As shown in FIG. 5, the vibration sensitivity of an oscillator package as generally described in conjunction with FIGS. 1-4 for a vibration frequency of 1.5 kilohertz is shown as a function of various thicknesses of an alumina stiffener. The point 51 shows the vibration sensitivity is very large when the alumina thickness is extremely small (i.e. here less than 0.1 inches) whereas the vibration sensitivity drops as a function of increasing thickness of the package stiffener 42. The last data point 55 corresponds to a stiffener of 0.48 inches thickness firmly mounted on a 2.5 inch cube of aluminum and provides oscillators having a vibration sensitivity of approximately $9.5 \times 10^{-11}$. From this data it can be deduced that for most applications a base stiffener having a thickness between approximately 0.3 and 0.5 inches would be a reasonable compromise between size and performance.

It has also been found that to minimize the problem of non-uniform distribution of acceleration across the SAW resonator and to thus minimize the effects of less than ideal frit geometries, the rigidity of the SAW device itself should also be increased. This can be accomplished by either reducing the lateral dimensions of the substrate or increasing the thicknesses of the substrate or both. Reduced lateral dimensions not only significantly increases rigidity but also decrease the surface area coupled to external bending forces.

Figure 6:
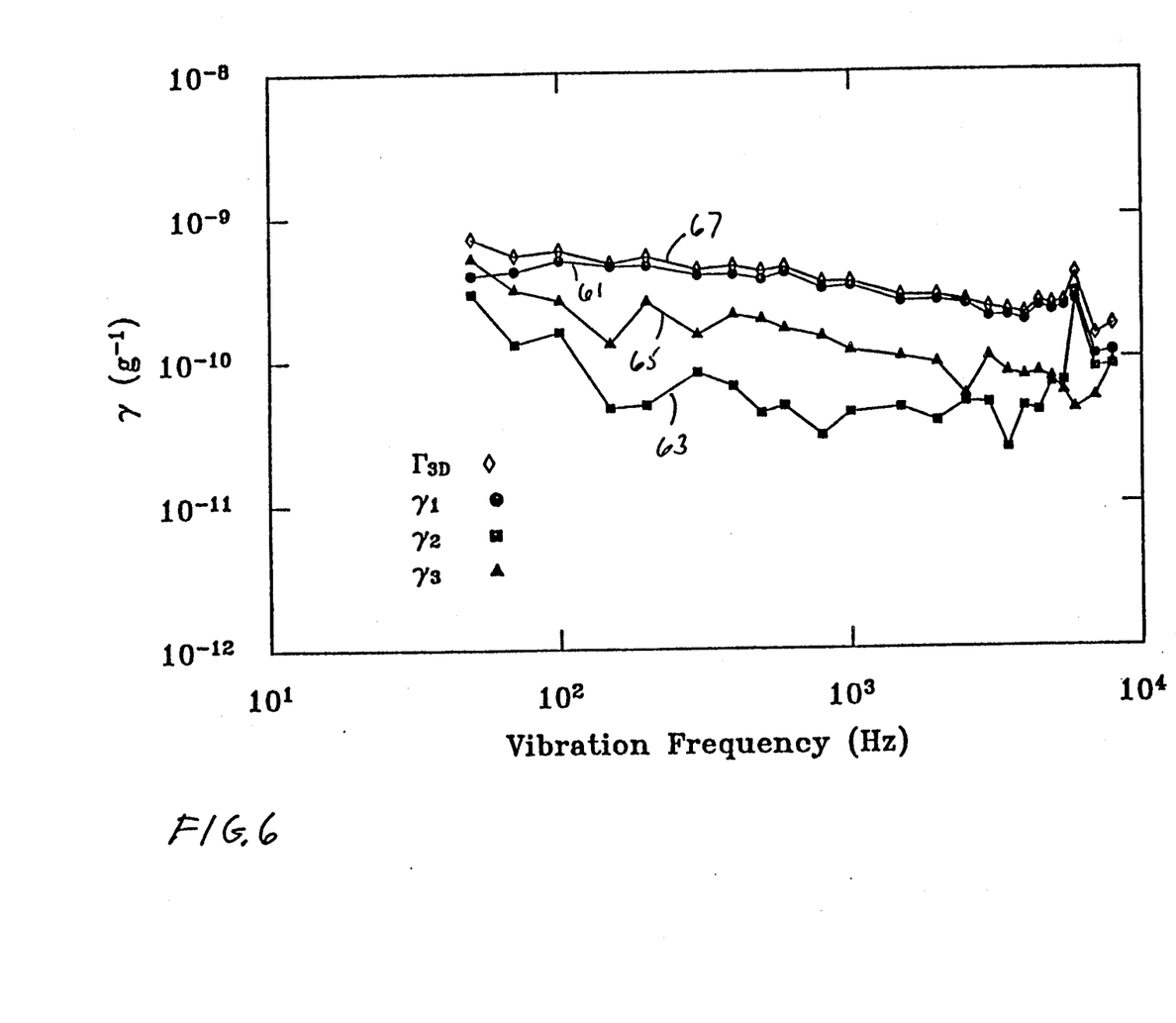
FIG. 6 is a plot of vibration sensitivities in each direction and total vibration sensitivity vs. vibration frequency using a standard size SAW device.

FIG. 6 shows a typical vibration sensitivity for all three axis of a SAW oscillator that uses an All-Quartz Package SAW resonator (Raytheon Company, Research Division) measuring 0.4 by 0.5 inches, a commonly used size. The thickness of the SAW substrate and cover are both 0.035 inches. The FIG. depicts vibration sensitivities where $\gamma_1$ is the vibration sensitivity for vibrations parallel to the substrate normal (curve 61), $\gamma_2$ is the vibration sensitivity for vibrations perpendicular to the acoustic propagation direction in the plane of the substrate (curve 63), $\gamma_3$ is the vibration sensitivity for vibrations parallel to the acoustic propagation direction in the plane of the substrate (curve 65) and $\Gamma_3$ is the vector sum of the sensitivities for the three perpendicular directions (curve 6). As can be seen, the vector sum of the individual vibration sensitivities ($\Gamma_3$) as a function of vibration frequency generally lie in the range of $1 \times 10^{-10}$ to $5 \times 10^{-10}(g^{-1})$.

Figure 7:
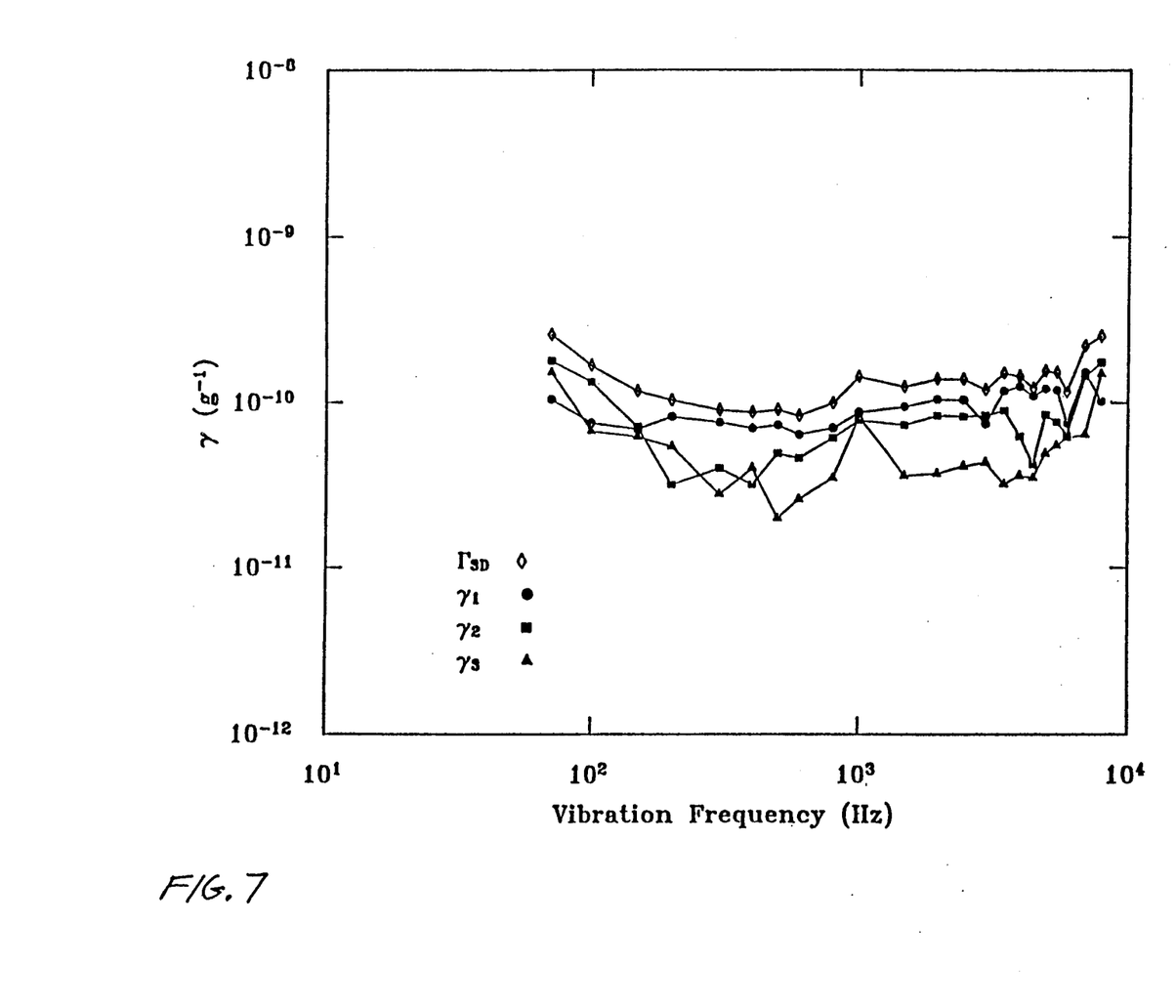
FIG. 7 is a plot of vibration sensitivity in each direction and total vibration sensitivity vs. vibration frequency using a miniaturized SAW package.

FIG. 7 shows measured vibration sensitivity for a SAW oscillator having an All-Quartz Package SAW resonator (Raytheon SMDO) that measures 0.16 by 0.33 inches. The substrate and the cover of the SAW package again were 0.035 inches thick. Even though the frit geometry used in the SAW package is not one of the ones identified in the article as being optimum, the overall vibration sensitivity for the device measured in FIG. 7 is significantly lower than that shown in FIG. 6. These characteristics for both devices were measured using conventional SAW oscillator packaging techniques. Unlike the SAW oscillator depicted in FIG. 2, the resonator used in FIG. 7 corresponds to a "Mini-AQP" package and is provided by disposing the glass frit as close to the SAW resonators as is practical allowing for slight glass reflow during the manufacturing operation of providing the glass frit seal. The aspect ratio of the glass frit seal is 2.2. This permits the SAW package for the resonator to be substantially smaller than the conventional SAW All-Quartz Package described in conjunction with FIG. 2. With a smaller package, the SAW device itself is also more rigid and thus has a lower vibration sensitivity. Further, with a smaller package there is also a smaller surface area through which to couple applied external stresses.

A preferred technique to fabricate an All Quartz Package is generally described in copending applications Ser. No. 221,449 filed Jun. 29, 1988 by Greer et. al. and Ser. No. 650,017 filed Sep. 13, 1984 by Borcheldt et. al. both assigned to the assignee of the present invention and both incorporated herein by reference. To provide a mini-AQP, the glass frit seal is positioned as close as possible to the interdigitated transducers without touching the transducers or interfering with surface wave propagation. The cover and base substrates are also cut correspondingly as small as possible to thus reduce the overall size of the package.

Optimally, a "mini-AQP" may be used in an oscillator package 31 having stiffeners 42, 44 as described in conjunction with FIGS. 2-4.

In high vibration environments, it is desirable to mount the SAW oscillator packages on a vibration isolation mount as would be known by one of skill in the art.

One example of an isolation mount which would be preferred would include a mounting plate, comprised of a stiff metal, having four holes disposed on thinned corner regions of the plate to receive plastic or rubber type grommets. A preferred grommet is a type obtained from EAR, Inc., EAR Type 401-1 fabricated from polyvinylchloride (PVC). Generally, such an assembly would be desired to have a known fundamental resonant frequency. To insure optimum operation and hence maximum damping of vibrations, the grommets which serve as mounting holes for the plate are prestressed by passing fasteners through each hole in the grommet, and the grommets as well as the rest of the assembly are maintained at a predetermined temperature as here 60° C. This maintains the proper temperature for the SAW device and proper durometer rating for the grommets.

Having described preferred embodiments of the invention, it will now become apparent to one of skill in the art that other embodiments incorporating their concepts may be used. It is felt, therefore, that these embodiments should not be limited to disclosed embodiments, but rather should be limited only by the spirit and scope of the appended claims.

What is claimed is:

1. A SAW oscillator comprising:
   means for providing a closed loop having an integral multiple of $2\pi$ radians phase shift and excess small signal gain at a frequency said means including a surface acoustic wave device disposed to stabilize the frequency and phase characteristics of said means;

a package comprising a base having a first stiffness characteristic supporting said providing means, and means disposed on said base for increasing the stiffness characteristic of said base.

2. The oscillator, as recited in claim 1, wherein said stiffening means includes a slab of material having a relatively high Young's modulus compared to the corresponding Young's modulus characteristic of the material of the package.

3. The oscillator, as recited in claim 1, where said means comprises a slab of aluminum oxide.

4. The oscillator, as recited in claim 1, further comprising a cover disposed over the oscillator package, said cover having a second stiffness characteristic and said oscillator further comprising second means disposed over said cover for increasing the stiffness characteristic of said cover.

5. The oscillator, as recited in claim 4, wherein said second means is a slab of aluminum oxide.

6. The oscillator recited in claim 1 wherein the base has a first surface supporting the providing means and a second surface having disposed thereon the stiffness increasing means.

7. A SAW oscillator comprising:

A SAW device comprising:
 a substrate having a surface which supports surface wave propagation and having coupled to said surface wave propagation a pair of transducers;
 a cover disposed to enclose said surface wave propagation surface of said SAW device; and
 a glass frit seal disposed between said cover and said substrate;
means for providing a closed loop having an integral number of $2\pi$ radians of phase shift and a excess small signal gain at a frequency with said closed loop providing means including said SAW device;

an oscillator package comprising:
 a base supporting said SAW device, said base having a first stiffness characteristic;
 a cover disposed to enclose said base portion of the oscillator package, said cover having a second stiffness characteristic;
 means, disposed on said base portion of the oscillator package for increasing the stiffness characteristic of said base; and
 means, disposed on said cover portion of the oscillator package for increasing the stiffness characteristic of said cover.

8. The SAW device, as recited in claim 7, wherein said means for stiffening the cover is a slab of material having a stiffness characteristic which is higher than the stiffness characteristic of said cover portion of the oscillator package.

9. The oscillator, as recited in claim 8, wherein said material is aluminum oxide.

10. The oscillator, as recited in claim 7, wherein said means for stiffening the base is a slab of material having a stiffness characteristic substantially higher than the stiffness characteristic of the base portion of said oscillator package.

11. The oscillator, as recited in claim 10, wherein said slab of material is aluminum oxide.

12. The SAW oscillator, as recited in claim 11, wherein said slab of material has a thickness in the range of 0.1 to 0.5 inches.

13. The SAW oscillator, as recited in claim 11, wherein said slab of material has a thickness in the range of 0.3 to 0.5 inches.

* * * * *